United States Patent [19]

Swanson et al.

[11] 4,001,716
[45] Jan. 4, 1977

[54] VARIABLE FREQUENCY DIGITAL OSCILLATOR

[75] Inventors: Ronald L. Swanson; Lyle R. Strathman, both of Cedar Rapids, Iowa

[73] Assignee: Rockwell International Corporation, El Segundo, Calif.

[22] Filed: Feb. 17, 1976

[21] Appl. No.: 658,421

[52] U.S. Cl. .................................. 331/48; 307/271; 307/273; 328/196; 328/207; 331/55; 331/145; 331/177 R
[51] Int. Cl.² ........................................ H03K 3/02
[58] Field of Search ............................. 331/46–50, 331/55, 56, 113 R, 144, 145, 177 R; 328/63, 196, 207; 307/269, 271, 273

[56] References Cited

UNITED STATES PATENTS 3,764,992  10/1973  Milne .............................. 331/49 X Primary Examiner—Siegfried H. Grimm
Attorney, Agent, or Firm—Richard W. Anderson; Robert J. Crawford

[57] ABSTRACT

A digital oscillator with output frequency accurately changeable from one period to the next. A plurality of retriggerable monostable multivibrators having discretely different design pulse widths are OR'd to an output monostable multivibrator having the narrowest design pulse width. The plurality of monostable multivibrators are triggered in common by the OR'd outputs thereof such that the longest pulse width one thereof defines the period of the output monostable multivibrator. Logic enabling means permit selection of multivibrator outputs to be OR'd.

9 Claims, 7 Drawing Figures

VARIABLE FREQUENCY DIGITAL OSCILLATOR

This invention relates generally to periodic waveform generators and more particularly to a variable frequency digital oscillator, the frequency of which is accurately changeable from one period to the next.

The invention to be herein described finds usage as a clock pulse generating source for a system wherein it is desired that the frequency or repetition rate of the clock pulse source be changeable on a cycle-by-cycle basis between an instantly realized repetition rate to a selected different repetition rate.

Although not specifically limited thereto, the variable frequency oscillator clock generator of the present invention is useful as a controllable clock source for a digital cathode ray tube deflection generation system such as defined in our co-pending application Ser. No. 630,389, filed 11/10/75, assigned to the assignee of the present invention entitled "Circle/Graphics CRT Deflection Generation Using Digital Techniques." In systems of the type defined in the referenced co-pending application, the deflection of a cathode ray tube beam is accomplished by the development of running digital counts in a pair of binary counters, one such count defining horizontal deflection of the cathode ray tube beam and the other of the counters developing a count commanding vertical deflection of the cathode ray tube beam. Such systems employ digital-to-analog converters by means of which the count contained at any time within the two counters is converted to analog sweep deflection voltages for the cathode ray tube. Depending upon the manner in which the respective deflection counters are incremented or decremented, the instant deflection voltage command change may involve X deflection only, Y deflection only, or X and Y deflection simultaneously by the same counter defined increment. In systems of this type, the source of clock pulses is gated to the respective X and Y binary counters such that the counters when receiving clock pulses are incremented at a clock defined increment rate. If only one of the counters is incremented at a given period of time, the beam whose deflection is defined by the count within that counter is caused to be deflected by incremental analog voltage increases such that the beam travels at a clock defined rate along the phosphor surface of the cathode ray tube, and the brightness of the image on the cathode ray tube caused by the moving beam is a direct function of the clock repetition rate. Should, however, both of the X and Y counters be incremented simultaneously, the resultant of the deflection voltage imparted to the beam is that of orthogonal like voltage or current commands such that the resultant is 1.414 times that of either of the vertical or horizontal command increments. As a result, the beam must travel 1.414 times the distance it would travel in a given time increment defined by the clock should but one of the X and Y counters be incremented, with the result that the image on the cathode ray tube is 1.414 times dimmer for the resultant 45° deflection vector than it would be for a purely horizontal or vertical deflection increment. The present invention may uniquely, in response to such simultaneous X and Y commands, change the period of the clock to a period that is 1.414 times longer than that for X or Y commands only.

Accordingly, the object of the present invention is to provide a variable frequency digital oscillator useable as a clock source whose frequency (repitition rate) may be changeable from one clock period to the next.

Further object of the present invention is the provision of the variable frequency digital oscillator clock pulse generator repetition rate of which may be changeable from one period to the next to any one of a plurality of preselected repetition rates.

The present invention is featured in the provision of a plurality of retriggerable monostable multivibrators having discretely different output pulse widths. The output of the shortest pulse width one of the multivibrators comprises the output from the digital oscillator of the invention. Feedback means are employed to apply the output of each of the plurality of multivibrators exclusive of an output one of the multivibrators, as a triggering input to each of the multivibrators. Upon initialization by an external triggering of voltage transition the output from the oscillator comprises a pulse train the pulse width of which is defined by the period of the output one of the plurality of monostable multivibrators, and the period of which is defined by the pulse width of a selected one of the multivibrators having respective periods discretely different than and greater than the output multivibrator. The output repetition rate controlling one of the multivibrators may be selectively gated into the triggering feedback means of the system or, alternatively, plural ones of the multivibrators may be gated back as triggering inputs to the system with the longest pulse width one of the multivibrators, so gated, controlling and defining the repetition rate of the output waveform of the oscillator.

These and other objects and features of the present invention will become apparent upon reading the following description in conjunction with reference to the accompanying drawing in which.

The present invention uniquely employs a plurality of retriggerable monostable multivibrators in a feedback system such that the negative going trailing edge of the output pulses from each of the multivibrators is instrumental in retriggering all of the multivibrators, with the net result that the multivibrator having the longest design pulse width is instrumental in determining the repetition rate of the pulse train output from the system.

Figure 1:
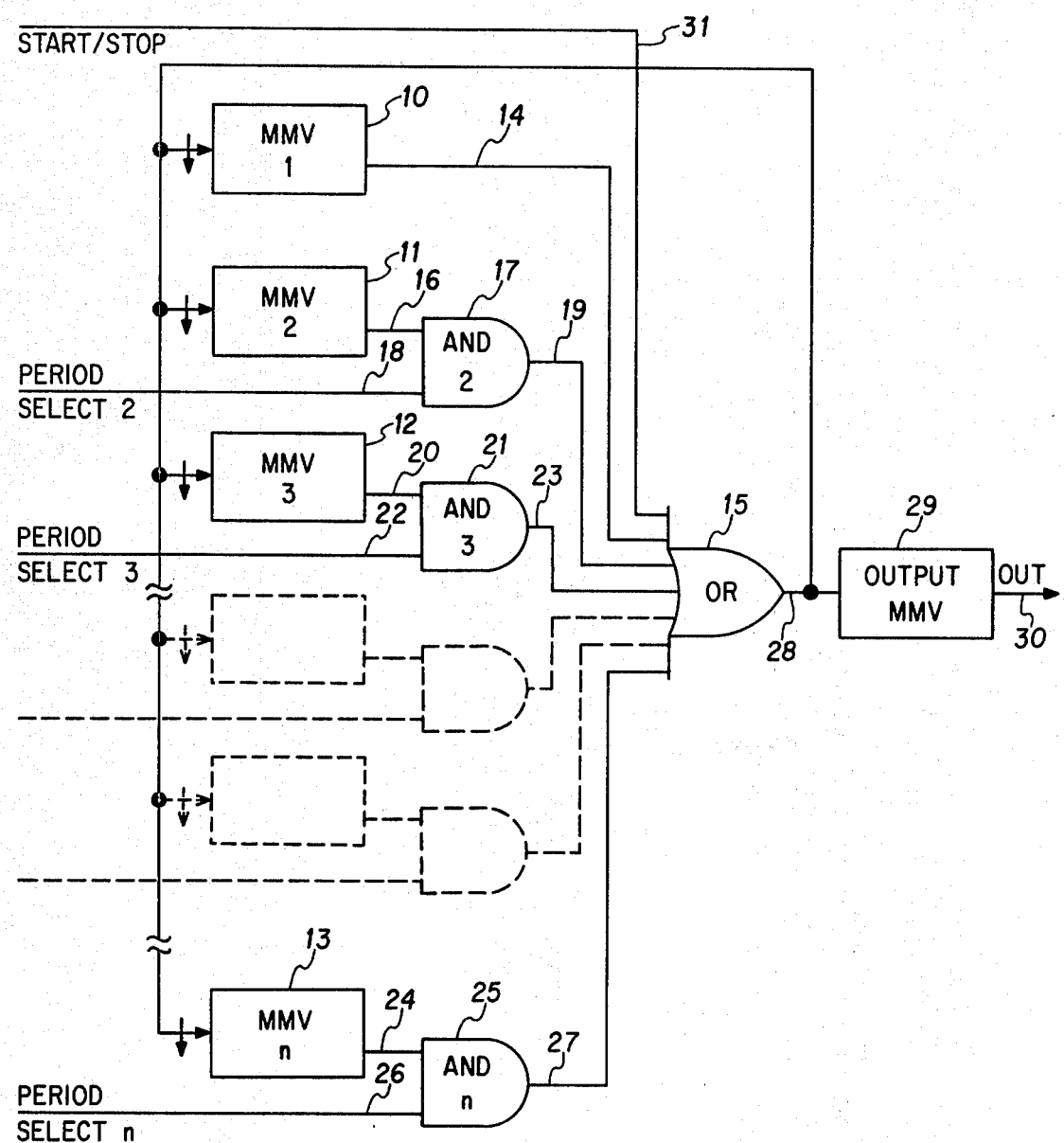
FIG. 1 is a functional block diagram of the variable frequency digital oscillator of the present invention.

With reference to FIG. 1, the digital oscillator comprises a plurality of retriggerable monostable multivibrators including a first multivibrator 10, a second multivibrator 11, a third multivibrator 12, and an "Nth" multivibrator 13. Each of the plurality of retriggerable monostable multivibrators receives a common triggering input 28. The output 14 from multivibrator 10 is applied as an input to an OR gating means 15 as is a stop/start trigger input line 31. The outputs of the remaining ones of the multivibrators are each selectively applied as further inputs to OR gating means 15. For this purpose, the output 16 of the second monostable multivibrator 11 is applied as a first input to an AND gating means 17. A period select line 18 is applied as a second input to AND gating means 17, with the output 19 from AND gate 17 applied as input to OR gating means 15. Similarly, the output 20 from the third monostable multivibrator 12 is applied as a first input to AND gating means 21 to which a further period select line 22 is applied as a second input, with the output 23 from AND gate 21 applied as input to OR gating means 15. The Nth depicted one of the monostable multivibrators 13 has its output 24 applied as a first input to an AND gating means 25 to which a period select line 26 is applied as a second input, with the output 27 from AND gating means 25 applied as input to OR gating means 15. The output 28 from OR gating means is applied to an output monostable multivibrator 29, the output 30 of which comprises the output of the digital oscillator system. The output 28 from OR gating means 15 is additionally applied back to the previously referenced trigger feedback input line to each of the monostable multivibrators 10, 11, 12, —, 13.

Each of the monostable multivibrators depicted in FIG. 1, including the output monostable multivibrator 29, has a discretely different design pulse width. The pulse width of the output monostable multivibrator 29 is chosen to be narrower than any of the other multivibrators in the system. The design pulse width of the first monostable multivibrator 10 is greater than that of the output monostable multivibrator 29 and less than any of the remaining multivibrators in the system. Each of the monostable multivibrators 11, 12, —, 13 (any selected plurality) has a discretely different design output pulse width greater than that of the first monostable multivibrator 10.

Figure 2:
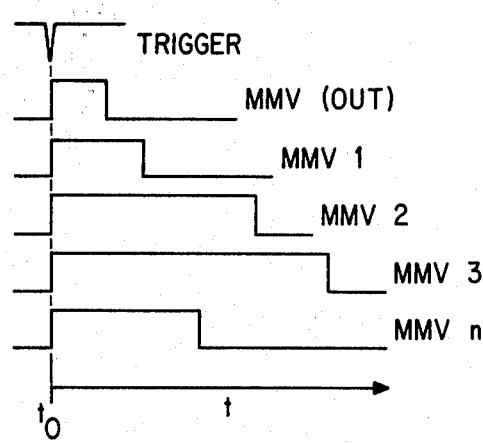
FIG. 2 depicts exampled output waveforms of the multivibrators of FIG. 1 in response to a triggering input and in the absence of further triggering influences.

FIG. 2 illustrates as an example the design output pulse widths of the multivibrators depicted in FIG. 1, in response to a negative going trigger input thereto. The output 30 of output multivibrator 29, in response to a trigger input thereto, is seen to provide the shortest pulse width, with the output 14 from the first monostable multivibrator 10 being greater than that of the output monostable multivibrator 29 and less than that of the other exampled monostable multivibrators 11, 12 and 13, each of which has a discretely different design output pulse width greater than that of the first monostable multivibrator 10.

From an operational standpoint, all of the monostable multivibrators in the system of FIG. 1 are retriggerable, and thus, all of the monostable multivibrators restart their outputs whenever a negative going trigger input is applied. Thus, in the system of FIG. 1, all of the monostable multivibrators in the system restart their outputs whenever the output 28 from the OR gating means 15 goes low. The term "restart", as used herein to define the operation of the monostable multivibrators, infers that, when triggered under quiescent conditions (low output), the multivibrators develop a high level output pulse for a design pulse width duration in the absence of any further triggering intake during the time period defined by their output pulse period.

Should any one of the multivibrators by retriggered during its design output pulse period, the output pulse period thereof is extended for a further design pulse width time period. Thus, should any one of the retriggerable monostable multivibrators be first triggered, and then successively triggered within the high output pulse periods thereof, the output from that multivibrator remains at a high state. The restarting feature of a retriggerable monostable multivibrator is accomplished by means which instantly "dump" the charge on the capacitor of the RC network therein in response to a triggering input.

Referring again to the system of FIG. 1, the output 14 of the first monostable multivibrator 10 is applied directly to the OR gating means 15, while those of the multivibrators 11 through 13 are selectively applied to the OR gating means 15 during the presence of a high level enabling voltage on the period select lines applied to the associated AND gate. In the absence of an enabling voltage level on any of the period select lines for multivibrators 11 through 13, the output of multivibrator 10 alone is applied through OR gate 15, and the trailing edge of the output 14 from multivibrator 10 triggers the output multivibrator 29 as well as retriggering monostable multivibrator 10, such that the output 30 from the system is defined by a pulse train the pulse durations of which are defined by the design pulse period of output multivibrator 29, and the repetition rate of which is defined by the design pulse duration of monostable multivibrator 10. Thus, since the pulse width of monostable multivibrator 10 is the smallest of the pulse widths of the monostable multivibrators applied to OR gate 15, the pulse width of monostable multivibrator 10 corresponds to the smallest repetition period possible for the oscillator system to output at output 30.

Now, should any one of monostable multivibrators 11 through 13 be enabled, such that its output is passed through an associated AND gate as a further input to OR gate 15, the longest pulse period one of these enabled multivibrators will be seen to define the pulse repetition period of the oscillator output at oscillator output 30. Any one of the period select lines may be high for a given period, but if more than one is high, the one selecting the monostable with the longest output pulse width will determine the period of the oscillator output 30 for that cycle. Again, if none of the period select lines are high, the first monostable multivibrator 10 determines the output pulse period. It will be seen from further description that, in addition to providing the smallest period available, the first monostable multivibrator 10 also provides a blanking pulse so that when its output 14 is high, the period enable lines for monostable multivibrators 11 through 13 can change output level without glitching the OR gate output 28. Thus means will be defined whereby the level of the period select lines will be caused to change only when the output 14 from the first monostable multivibrator 10 is high so as to avoid any glitching of the output 28 from OR gating means 15.

In operation, the oscillator is started by bringing the start/stop line 31 low. This low voltage transition is passed through OR gating means 15 to the OR gate output 28 which triggers all of the oscillators 10 through 13. Once started, the oscillator will free run until such time as the stop/start line 31 is brought high again. When the stop/start line goes low, all the monostables start their associated output pulses. The period select line that is high then selects the monostable multivibrator output corresponding to the period desired for that cycle, and causes the associated AND gate output to stay high, keeping the output of the OR gate 15 high, until that selected monostable pulse width expires. When the selected monostable multivibrator pulse width does expire, the output of the OR gate 15 goes low and all of the monostable multivibrators fire again to begin a new cycle.

Figure 3:
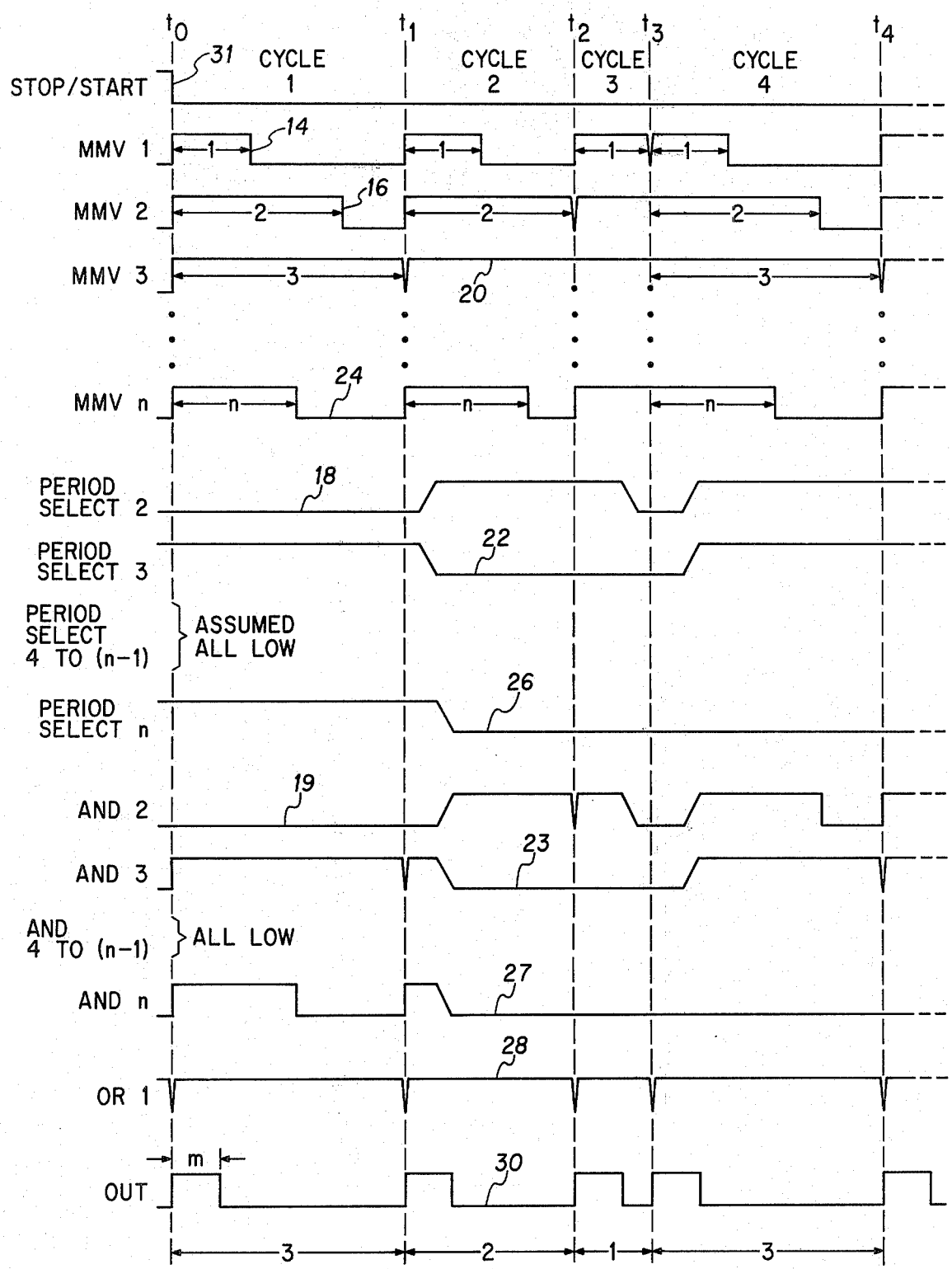
FIG. 3 depicts operational waveforms of the oscillator of FIG. 1 for an exampled control sequence of output waveform repetition rate.

FIG. 2 illustrates four exampled periods of the oscillator of FIG. 1. The period enable lines not shown in the waveforms of FIG. 3 are assumed to be low for this example. The period of the depicted cycle No. 1 is defined by the width of the output pulse 20 from the third monostable multivibrator 12, since the period select lines 22 and 26 associated with multivibrators 12 and 13 are low, and monostable multivibrator 12 has a longer pulse output than that of the Nth multivibrator 13. The width of cycle No. 2 is defined by the second monostable multivibrator 11, since only the period select line 18 associated with monostable multivibrator 11 is high when the output pulse 14 from the monostable multivibrator 10 expires. In cycle No. 3, no one of the period select lines is high at the expiration of the output pulse 14 from monostable multivibrator 10, such that monostable multivibrator 10 determines the output period. Cycle No. 4 is similar to cycle No. 1, except that the period select line 18 associated with monostable multivibrator 11 and the period select line 22 associated with monostable multivibrator 12 are high, and monostable miltivibrator 12 has a longer pulse output than that of monostable multivibrator 11, thus monostable multivibrator 12 again defines the width of the output cycle. It is to be noticed with reference to the waveforms of FIG. 3 that any changing of the level of the period select lines always is caused to occur when the output 14 from monostable multivibrator 10 is high to avoid any glitching of the output 28 from OR gate 15. The waveforms of FIG. 3 also depict that, since the multivibrators in the system are retrigerable, they all restart their outputs whenever the output 28 from OR gate goes low.

FIG. 3 graphically illustrates, in the lower depicted waveform thereof, the output 30 from the system as comprised of a train of pulses 30 the widths of which are defined by the pulse width of the output multivibrator 29, with the repetition rates of the output 30 being defined, on a cycle-by-cycle basis, by the particular permutation of high level period select lines existing at the end of successive ones of the output pulses from 14 from monostable multivibrator 10. Any changes in levels of the period select lines are illustrated as occurring during the pulse duration time of successive pulses from monostable multivibrator 10, the output 14 of which is continually applied to the OR gate as a blanking pulse to preclude a negative transition in the output 28 from OR gate 15 during the time duration of output pulses from monostable multivibrator 10.

Figure 4:
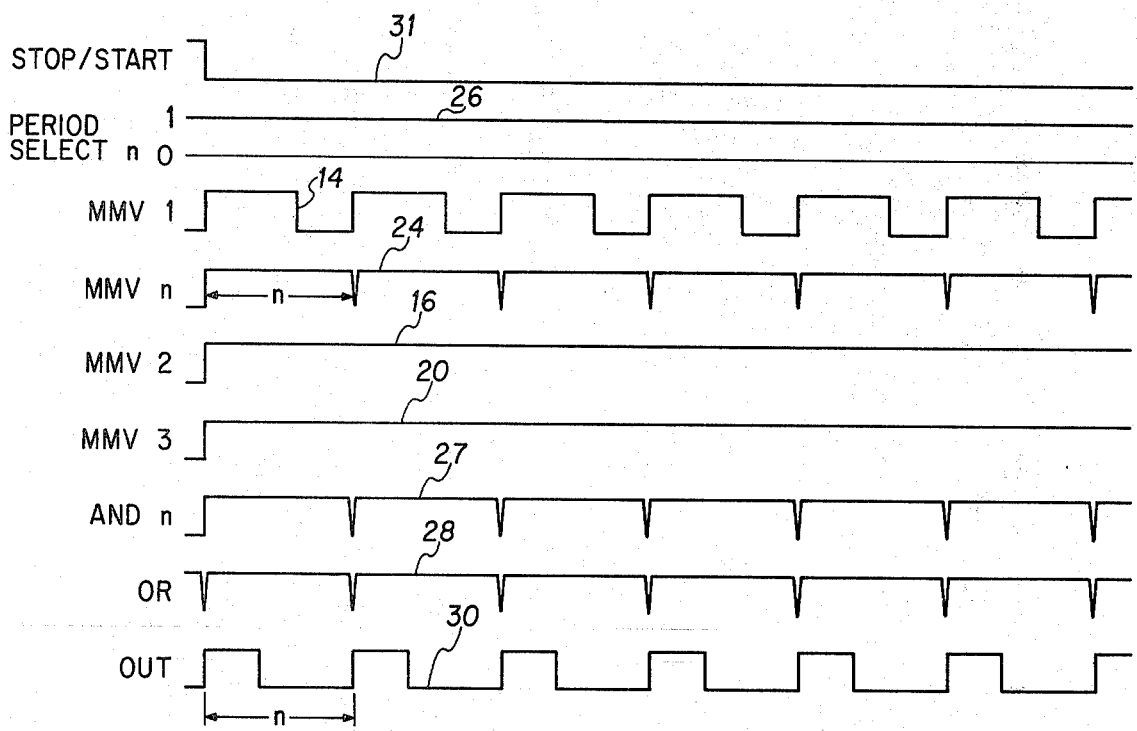
FIG. 4 depicts operational waveforms for continuous oscillator control under the influence of a selected one of the multivibrators.

FIG. 4 depicts operational waveforms with period select line 26 associated with the Nth multivibrator 13 assumed high at the time of a start/stop line 31 negative transition, and all other period enable lines assumed low. The waveforms depict repeated retriggering of multivibrators 11 and 12, which have design pulse widths greater than that of enabled multivibrator 13.

The output 14 from monostable multivibrator 10, in having a lesser pulse duration than that of the enabled monostable multivibrator 13 successively outputs pulses at its designed pulse width. Since the output 24 of multivibrator 13 is gated to the OR gate 15, the period of the output pulses 30 from the oscillator system are defined by the duration of the output pulses 24 from multivibrator 13. The depicted outputs 16 and 20 from nonenabled multivibrators 11 and 12 respectively are seen to remain at a high level since they are retriggered by successive negative going transitions of the output pulses 24 from the enabled multivibrator 13 at time periods which are less than their respective design output pulse widths and thus restart their outputs repeatedly.

Figure 5:
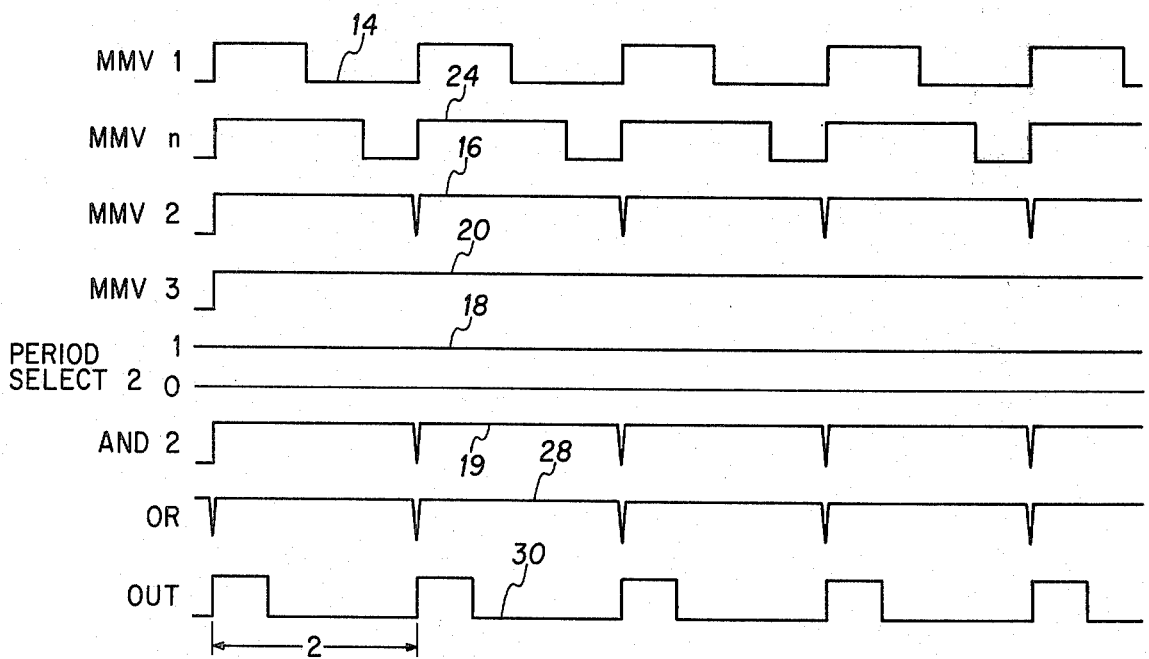
FIG. 5 illustrates operational waveforms depicting output repetition rate control under the influence of a further one of the plurality of multivibrators.

The waveforms of FIG. 5 depict a further operational sequence wherein only the period enable line 18 associated with the second multivibrator 11 is assumed to be high at the instant of a start/stop input pulse such that the output 30 of the oscillator system is defined by a pulse train having pulse widths defined again by the design pulse width of output multivibrator 29 and a repetition rate defined by the pulse width of the enabled multivibrator 11. The waveforms show repeated retriggering of multivibrators 12, the only one with a design pulse width greater than enabled multivibrator 11.

Figure 6:
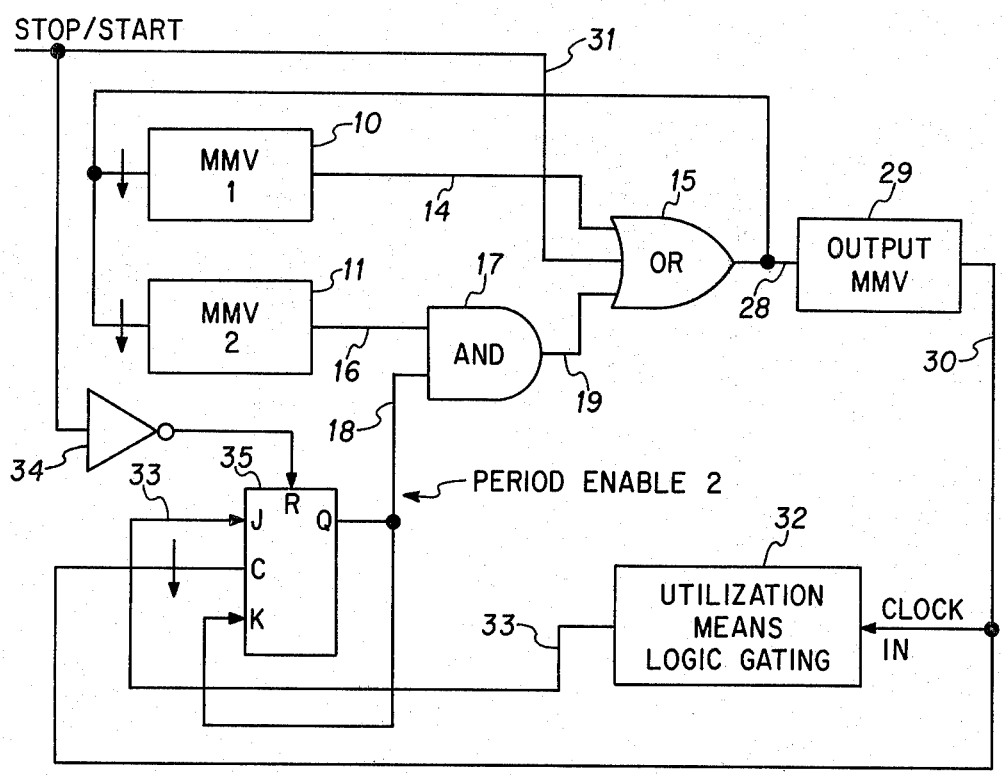
FIG. 6 is a functional diagram of a control system for selectively changing the repetition rate of the output waveform.
Figure 7:
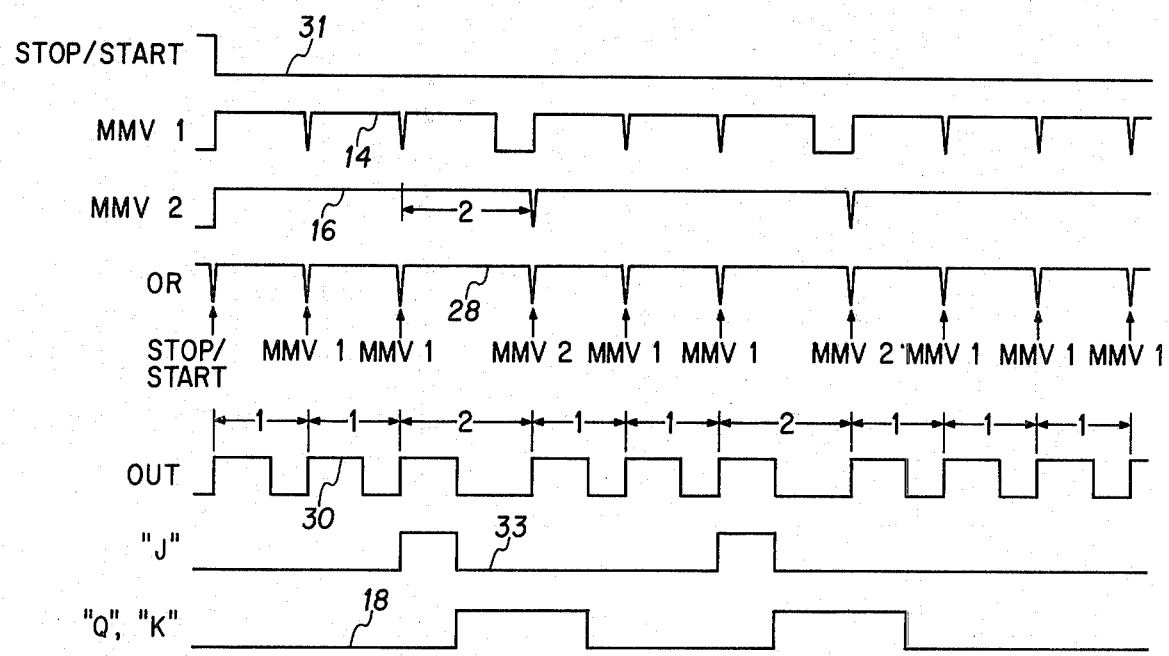
FIG. 7 depicts operational waveforms related to the operation of the control system of FIG. 6.

FIG. 6 illustrates an exemplary system utilizing the digital oscillator of the present invention controlled to establish one or the other of two discrete output repetition rates on a cycle-by-cycle basis in response to logic conditions existing in a utilization means employing the digital oscillator output as a clock input thereto.

The system of FIG. 6 includes the OR gating means 15 and output monostable multivibrator 29 with the OR gating means receiving a stop/start impulse line 31, the output from the first monostable multivibrator 10 and, selectively, the output from a second monostable multivibrator 11. The period enable line 18 for the second monostable multivibrator 11 is applied as an enabling input to AND gate 17 which receives the output 16 from the second multivibrator 11. The system of FIG. 6 illustrates the utilization logic gating means 32 receiving the output 30 of output multivibrator 29 as a clock input thereto, and providing an output 33, which might comprise discretely gated ones of the output pulses on line 30. Lines 30 and 33 might then comprise, for example, the major axis pulse train and minor axis pulse train lines of the system defined in the above referenced copending application. The oscillator of the present invention, in conjunction with the depicted J-K flip-flop logic circuitry is responsive to the clock train pulses on line 30 and the predetermined ones of those pulses on line 33 to change the output level on period enable line 18 to enable the output from monostable mutivibrator 11 for the instant clock period during which a clock pulse is simultaneously present on lines 33 and 30. The repetition rate of the output pulse train from output multivibrator 29 is then defined as the pulse duration of output pulse 16 from monostable multivibrator 11. In the absence of simultaneous clock pulses on lines 30 and 33, the period enable line 18 goes low such that the period of that cycle of the output clock train on line 30 is defined by the shorter pulse duration time of the first monostable multivibrator 10.

Referring to FIG. 6, the stop/start line 31, in addition to being applied to the OR gating means 15, is applied through inverter 34 as a reset input to J-K flip-flop 35. The Q output of flip-flop 35 comprises the period enable line 18. Gated ones of clock pulses 30 appearing on output 33 from utilization means 32 are applied to the J input of flip-flop 35. The Q output of flip-flop 35 is connected to the K input thereof and the output clock pulse train 30 from monostable multivibrator 29 is applied as a clock input to flip-flop 35.

In operation, let it be assumed that, at the instant of a negative going stop/start line 31 transition, the utilization logic gating means 32 is not conditioned to output gated ones of clock pulses 30 on its output line 33. The second multivibrator 11 output does not appear on the output 19 of AND gate 17, and monostable multivibrator No. 1 controls the repetition rate of that clock cycle from output multivibrator 29 as the pulse duration of the output pulse from monostable multivibrator 10. This repeats in the second depicted cycle. The third one of the output clock pulses 30 is gated by the utilization means 32 onto output line 33 and appears at the J input of flip-flop 35. The negative going trailing edge of this clock pulse on line 33 enables the setting of J-K flip-flop 35 to a high level Q output on line 18 to enable AND gate 17 to pass the output from the second multivibrator 11 to OR gate 15. The longer duration pulse from monostable multivibrator 11 then controls the repetition rate during that cycle. During the next cycle, an output pulse is assumed not to be gated onto line 33, such that at the trailing edge of the next output clock pulse, the J-K flip-flop is reset to a low level Q output to thus disable monostable multivibrator 11 from controlling the repetition rate. A still further clock pulse cycle is depicted under the same conditions with monostable multivibrator 10 determining the repetition rate, followed by a cycle wherein a second one of the output clock pulses is assumed to be gated onto line 33, whereupon the J-K flip-flop is triggered again to enable the second monostable multivibrator 11 to control the repetition rate of that clock cycle. It is noted that any change in the logic level of the period enable line 18 applied to AND gate 17 is caused to occur during the time duration of an output pulse from the first monostable multivibrator 10. Thus, the transitions of the enable line are precluded from glitching the ouput of OR gate 15 so as to cause an unwanted restart cycle of monostable multivibrators 10 and 11.

The digital oscillator herein described is thus seen to be capable of a change in repetition rate from one cycle to the next and, by means of including any number of monostable multivibrators having discretely different design pulse width times, the repetition rate of the output waveform may be caused to be changed on a cycle-by-cycle basis by enabling a preselected one or ones of the plurality of retriggerable monostable multivibrators.

Although the present invention has been described with respect to particular embodiments thereof, it is not to be so limited, as changes might be made therein which fall within the scope of the invention as defined in the appended claims.

What is claimed is:

1. A digital oscillator comprising, a plurality of retriggerable monostable multivibrators including a first multivibrator, an output multivibrator and at least one further multivibrator, said output multivibrator having a design output pulse width period less than said first multivibrator, each of said further multivibrators having discretely different output pulse widths greater than that of said first multivibrator, an OR gating means, the output of said first multivibrator and a bi-level trigger voltage source connected as respective first and second inputs to said OR gating means, means for selectively applying the output from at least one of said further multivibrators as further input to the input of said OR gating means, the output of said OR gating means applied as a common trigger input to each of said plurality of multivibrators, and the output of said output multivibrator comprising the output of said oscillator.

2. The digital oscillator of claim 1 wherein said means for selectively applying the output of said further multivibrator to said OR gating means comprises an AND gating means associated individually with each of said further multivibrators and receiving the output thereof, and means for selectively enabling and disabling said AND gating means to selectively apply the output of the associated multivibrator to said OR gating means.

3. The digital oscillator of claim 2 wherein said means for selectively enabling and disabling comprises means for precluding enablement and disablement of said AND gating means during time periods other than those defined by the duration of output pulses from said first multivibrator.

4. The digital oscillator of claim 3 wherein said means for selectively enabling and disabling comprises a binary level controlled voltage applied as input to said AND gating means.

5. The digital oscillator of claim 4 comprising means time synchronous with ones of output pulses from said output multivibrator to change the binary levels of said binary level controlled voltage.

6. The digital oscillator of claim 5 comprising logic switching means responsive to said output multivibrator pulses and further pulses time synchronous with ones of said output multivibrator pulses to develop said enabling and disabling binary level controlled voltage as applied to said AND gating means.

7. A digital oscillator comprising a plurality of retriggerable monostable multivibrators having discretely different output pulse widths, the output of the shortest pulse width one of said multivibrators comprising the output from said digital oscillator, feedback means applying the output of each multivibrator, exclusive of the output one of said multivibrators, as a triggering input to each of said multivibrators including the output one thereof, and means for initially triggering each of such multivibrators to develop an output from said output multivibrator the period of which is defined as the pulse duration time of the longest pulse width one of said multivibrators.

8. The digital oscillator of claim 7, including means for selectively disabling said feedback means.

9. The digital oscillator of claim 8, including means to selectively apply the output of individual ones of said multivibrators, exclusive of the output one thereof and the next longest pulse width one thereof, to said feedback trigger means.

* * * * *